(12) United States Patent
Chen et al.

(10) Patent No.: US 9,349,719 B2
(45) Date of Patent: May 24, 2016

(54) SEMICONDUCTOR DEVICE

(71) Applicant: Taiwan Semiconductor Manufacturing Company Limited, Hsin-Chu (TW)

(72) Inventors: Bo-Ting Chen, Fengyuan (TW); Li-Wei Chu, Hsinchu (TW); Wun-Jie Lin, Hsinchu (TW); Han-Jen Yang, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 61 days.

(21) Appl. No.: 14/483,227

(22) Filed: Sep. 11, 2014

(65) Prior Publication Data
US 2016/0079229 A1 Mar. 17, 2016

(51) Int. Cl.
*H01L 29/66* (2006.01)
*H01L 27/02* (2006.01)
*H01L 29/786* (2006.01)
*H01L 29/06* (2006.01)
*H01L 29/423* (2006.01)
*H01L 29/45* (2006.01)

(52) U.S. Cl.
CPC ........ *H01L 27/0285* (2013.01); *H01L 29/0649* (2013.01); *H01L 29/0676* (2013.01); *H01L 29/42392* (2013.01); *H01L 29/45* (2013.01); *H01L 29/78642* (2013.01)

(58) Field of Classification Search
CPC .............................. B82Y 10/00; H01L 29/785
USPC ............ 257/329; 438/142; 977/700, 720, 721
See application file for complete search history.

(56) References Cited

U.S. PATENT DOCUMENTS

| 7,714,356 B2 | 5/2010 | Abou-Khalil et al. |
| 2015/0060996 A1* | 3/2015 | Colinge ................ H01L 29/775 257/329 |
| 2015/0162403 A1* | 6/2015 | Oxland ............... H01L 29/0673 257/27 |

* cited by examiner

*Primary Examiner* — Jami M Valentine
(74) *Attorney, Agent, or Firm* — Cooper Legal Group, LLC

(57) ABSTRACT

A semiconductor device is provided. The semiconductor device includes a first transistor on a first side of a shallow trench isolation (STI) region and a second transistor on a second side of the STI region. The first transistor includes a first conductive portion having a second conductivity type formed within a well having a first conductivity type, a first nanowire connected to the first conductive portion and a first active area, and a first gate surrounding the first nanowire. The second transistor includes a second conductive portion having the second conductivity type formed within the well, a second nanowire connected to the second conductive portion and a second active area, and a second gate surrounding the second nanowire. Excess current from an ESD event travels through the first conductive portion through the well to the second conductive portion bypassing the first nanowire and the second nanowire.

20 Claims, 9 Drawing Sheets

SEMICONDUCTOR DEVICE

BACKGROUND

In a semiconductor device, such as a transistor, current flows through a channel region between a source region and a drain region upon application of a sufficient voltage or bias to a gate of the device. When current flows through the channel region, the transistor is generally regarded as being in an 'on' state, and when current is not flowing through the channel region, the transistor is generally regarded as being in an 'off' state.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
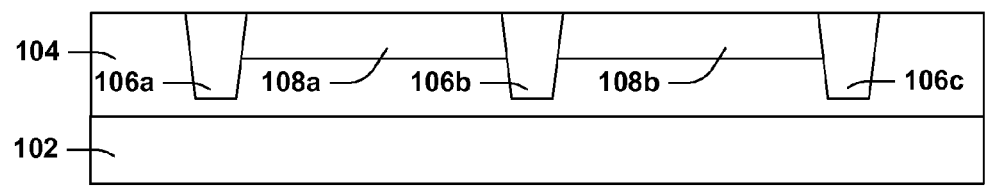
FIG. 1 is an illustration of a semiconductor device at a stage of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more techniques for forming a semiconductor device and resulting structures formed thereby are provided herein.

According to some embodiments, a semiconductor device comprises a first transistor on a first side of a shallow trench isolation (STI) region. In some embodiments, the first transistor comprises a first conductive portion formed within a well, a first nanowire connected to the first conductive portion, a first gate surrounding the first nanowire, and a first active area over the first nanowire. In some embodiments, the first conductive portion has a second conductivity type. In some embodiments, the first active area has the second conductivity type. In some embodiments, the well has a first conductivity type. In some embodiments, the first conductivity type comprises at least one of n-type or p-type. In some embodiments, the second conductivity type comprises n-type when the first conductivity type comprises p-type and comprises p-type when the first conductivity type comprises n-type. In some embodiments, a second transistor is on a second side of the STI region. In some embodiments, the second transistor comprises a second conductive portion formed within the well, a second nanowire connected to the second conductive portion, a second gate surrounding the second nanowire, and a second active area over the second nanowire. In some embodiments, the second conductive portion has the second conductivity type. In some embodiments, the second active area has the second conductivity type. In some embodiments, the second gate is connected to the first gate by a gate connection. In some embodiments, the first transistor is connected to the second transistor via an active area connection that connects the first active area to the second active area.

According to some embodiments, a first silicide portion is over the first conductive portion. In some embodiments the first silicide portion connects the first conductive portion to at least one of an input output (I/O) port, a first voltage supply (VDD), or a second voltage supply (VSS). In some embodiments, a second silicide portion is over the first conductive portion. In some embodiments, the second silicide portion is adjacent the first nanowire and not in contact with the first silicide portion. In some embodiments, the area over the first conductive portion where the first silicide portion and the second silicide portion are not in contact forms a first break. In some embodiments, a fifth silicide portion is over the first conductive portion. In some embodiments, the fifth silicide portion is between the first nanowire and the STI region.

According to some embodiments, a third silicide portion is over the second conductive portion. In some embodiments, the third silicide portion connects the second conductive portion to at least one of the VSS or the VDD when the first conductive portion is connected to the I/O port, the VSS when the first conductive portion is connected to the VDD, or the VDD when the first conductive portion is connected to the VSS. In some embodiments, a fourth silicide portion is over the second conductive portion. In some embodiments, the fourth silicide portion is adjacent the second nanowire and not in contact with the third silicide portion. In some embodiments, the area over the second conductive portion where the third silicide portion and the fourth silicide portion are not in contact forms a second break. In some embodiments, a sixth silicide portion is over the second conductive portion. In some embodiments, the sixth silicide portion is between the second nanowire and the STI region.

According to some embodiments, such as when an electrostatic discharge (ESD) event occurs, a voltage bias is applied to at least one of the first gate or the second gate, such that little to no current travels through at least one of the first nanowire or the second nanowire. In some embodiments, excess current from the ESD event travels through at least one of a first path from the first conductive portion through the well to the second conductive portion or a second path from the second conductive portion through the well to the first conductive portion, bypassing the first nanowire and the second nanowire. In some embodiments, bypassing the first nanowire and the second nanowire protects the first nanowire and the second nanowire from damage caused by excess ESD current, thereby increasing a functional lifetime of the first nanowire and the second nanowire as compared to a device that does not have a mechanism that bypasses or shunts current away from a nanowire during an ESD event. In some embodiments, at least one of the first path or the second path increases ESD discharge capability as compared to a semiconductor device that does not have one or more of such current discharge paths. In some embodiments, such as when the first gate is connected to a third voltage supply, a moderate amount of current from an ESD event travels through at least one of the first nanowire or the second nanowire, while a majority of excess current from the ESD event travels through at least one of the first path or the second path. In some embodiments, the third voltage supply is greater than or equal to the VSS.

In some embodiments, the first break inhibits current flow between the first silicide portion and the second silicide portion and promotes current flow in merely the first conductive portion. In some embodiments, the second break inhibits current flow between the third silicide portion and the fourth silicide portion and promotes current flow in merely the second conductive portion. Promoting current flow in merely one type of area, such as at least one of the first conductive portion or the second conductive portion, as opposed to both a silicide area and a conductive area yields a more uniform, consistent, predictable, etc. current flow. In some embodiments, current flow through two different types of material, such as a silicide material and a material of a conductive portion yields a first current at at least one of a first magnitude or first speed and a second current at at least one of a second/different magnitude or second/different speed. In some embodiments, a more uniform, consistent, predictable, etc. current flow promotes a more uniform, consistent, predictable, etc. device performance.

Figure 15:
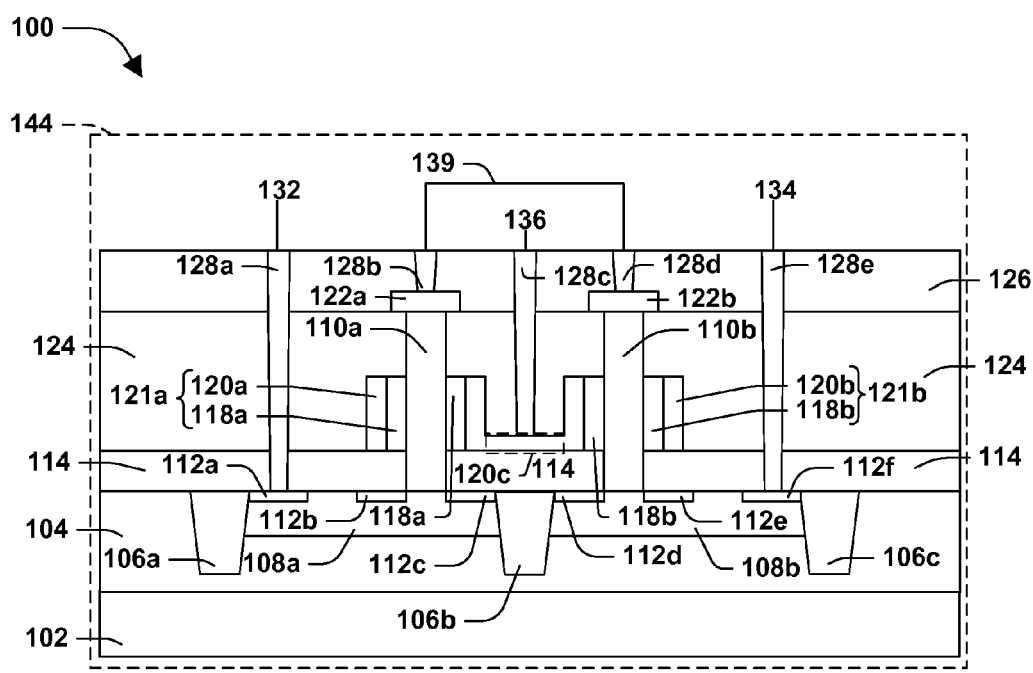
FIG. 15 is an illustration of a semiconductor device at a stage of fabrication, in accordance with some embodiments.
Figure 16:
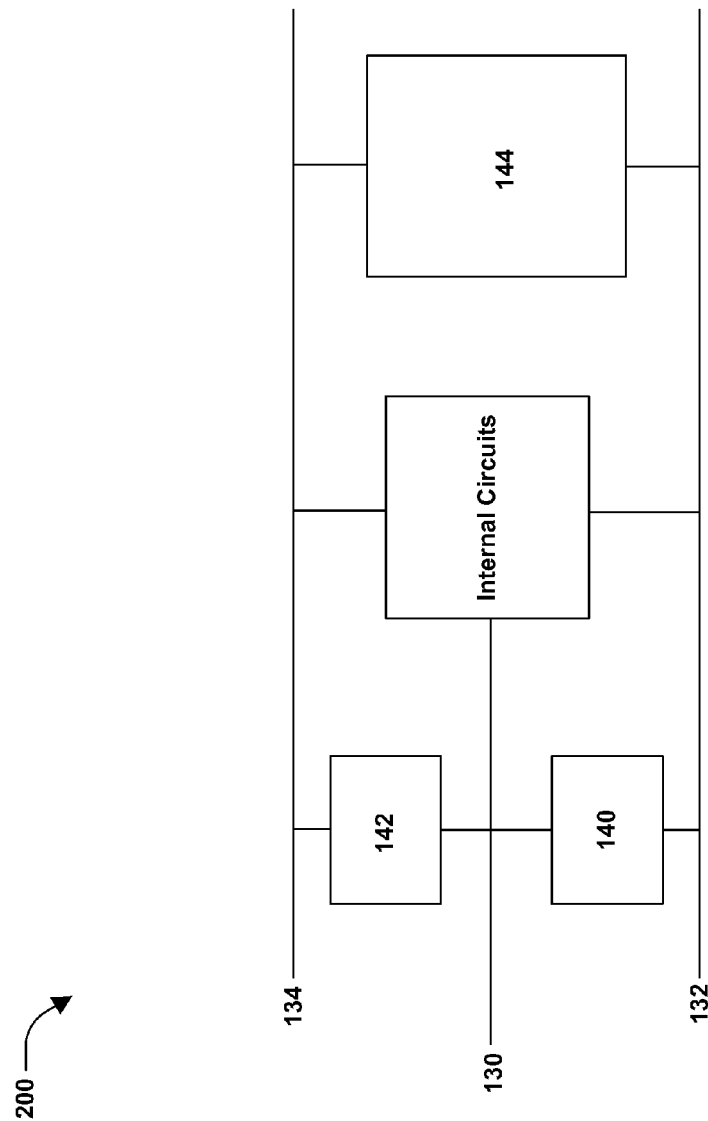
FIG. 16 is an illustration of a semiconductor arrangement at a stage of fabrication, in accordance with some embodiments.

FIGS. 1-15 are cross-sectional views of a semiconductor device 100, and FIG. 16 is a schematic illustration of a semiconductor arrangement 200, according to some embodiments, at various stages of fabrication. Turning to FIG. 1, a well 104 is over a substrate 102, according to some embodiments. In some embodiments, the substrate 102 includes at least one of an epitaxial layer, a silicon-on-insulator (SOI) structure, a wafer, or a die formed from a wafer. In some embodiments, the substrate 102 comprises at least one of silicon, carbon, etc. In some embodiments, the well 104 has a first conductivity type. In some embodiments, the first conductivity type comprises at least one of p-type or n-type. In some embodiments, the well 104 comprises at least one of silicon, carbon, etc. In some embodiments, the well 104 comprises at least one of an n-type dopant or a p-type dopant. In some embodiments, a first conductive portion 108a is within the well 104. In some embodiments, the first conductive portion 108a has a second conductivity type. In some embodiments, the second conductivity type comprises n-type when the first conductivity type comprises p-type and comprises p-type when the first conductivity type comprises n-type. In some embodiments, a second conductive portion 108b has the second conductivity type. In some embodiments, at least one of the first conductive portion 108a or the second conductive portion 108b comprises at least one of silicon, carbon, etc. In some embodiments, at least one of the first conductive portion 108a or the second conductive portion 108b comprises at least one of an n-type dopant or a p-type dopant.

According to some embodiments, a shallow trench isolation (STI) region 106b is between the first conductivity portion 108a and the second conductivity portion 108b. In some embodiments, the STI region 106b extends into the well 104. In some embodiments, a first STI region 106a is on an end of the first conductive portion 108a and a second STI region 106c is on an end of the second conductive portion 108b. In some embodiments, at least one of the first STI region 106a or the second STI region 106c extends into the well 104. In some embodiments, at least one of the STI region 106b, the first STI region 106a, or the second STI region 106c comprises a high dielectric constant material. In some embodiments, at least one of the STI region 106b, the first STI region 106a, or the second STI region 106c comprises at least one of nitride, oxide, etc.

Figure 2:
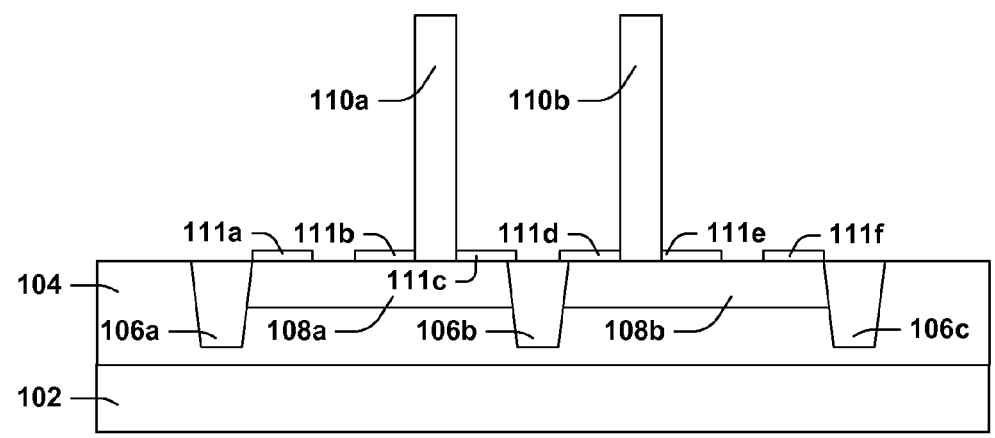
FIG. 2 is an illustration of a semiconductor device at a stage of fabrication, in accordance with some embodiments.

Turning to FIG. 2, a metal layer (not shown) is formed over the first conductive portion 108a, the STI region 106b, and the second conductive portion 108b, according to some embodiments. In some embodiments, the metal layer comprises at least one of tungsten, titanium, tin, etc. In some embodiments, the metal layer is patterned to form a first metal portion 111a, a second metal portion 111b, and a fifth metal portion 111c over the first conductive portion 108a. In some embodiments, the first metal portion 111a, the second metal portion 111b, and the fifth metal portion 111c are not in contact with one another. In some embodiments, the first metal portion 111a is adjacent the first STI region 106a. In some embodiments, the fifth metal portion 111c is adjacent the STI region 106b. In some embodiments, the second metal portion 111b is between the first metal portion 111a and the fifth metal portion 111c. In some embodiments, the metal layer is patterned to form a third metal portion 111f, a fourth metal portion 111e, and a sixth metal portion 111d over the second conductive portion 108b. In some embodiments, the third metal portion 111f, the fourth metal portion 111e, and the sixth metal portion 111d are not in contact with one another. In some embodiments, the third metal portion 111f is adjacent the second STI region 106c. In some embodiments, the sixth metal portion 111d is adjacent the STI region 106b. In some embodiments, the fourth metal portion 111e is between the third metal portion 111f and the sixth metal portion 111d.

According to some embodiments, a first nanowire 110a is formed between the second metal portion 111b and the fifth metal portion 111c. In some embodiments, a second nanowire 110b is formed between the fourth metal portion 111e and the sixth metal portion 111d. In some embodiments, at least one of the first nanowire 110a or the second nanowire 110b comprises at least one of silicon, carbon, etc. In some embodiments, at least one of the first nanowire 110a or the second nanowire 110b is a small conductive wire or structure, such as having one or more dimensions on the order of nanometers. In some embodiments, at least one of the first nanowire 110a or the second nanowire 110b has a height to thickness ratio greater than about 800. In some embodiments, the thickness is measured left to right on the page. In some embodiments, the height is measured top to bottom on the page. In some embodiments, the first nanowire 110a has a first thickness, measured left to right on the page, between about 5 nm to about 15 nm. In some embodiments, the first nanowire 110a has a first height, measured top to bottom on the page from a top surface of the first conductive portion 108a to a top surface of the first nanowire 110a, between about 50 nm to about 1500 nm. In some embodiments, the second nanowire 110b has a second thickness between about 5 nm to about 15 nm. In some embodiments, the second nanowire 110b has a second height between about 50 nm to about 1500 nm. In some embodiments, at least one of the first nanowire 110a or the second nanowire 110b is grown.

Figure 3:
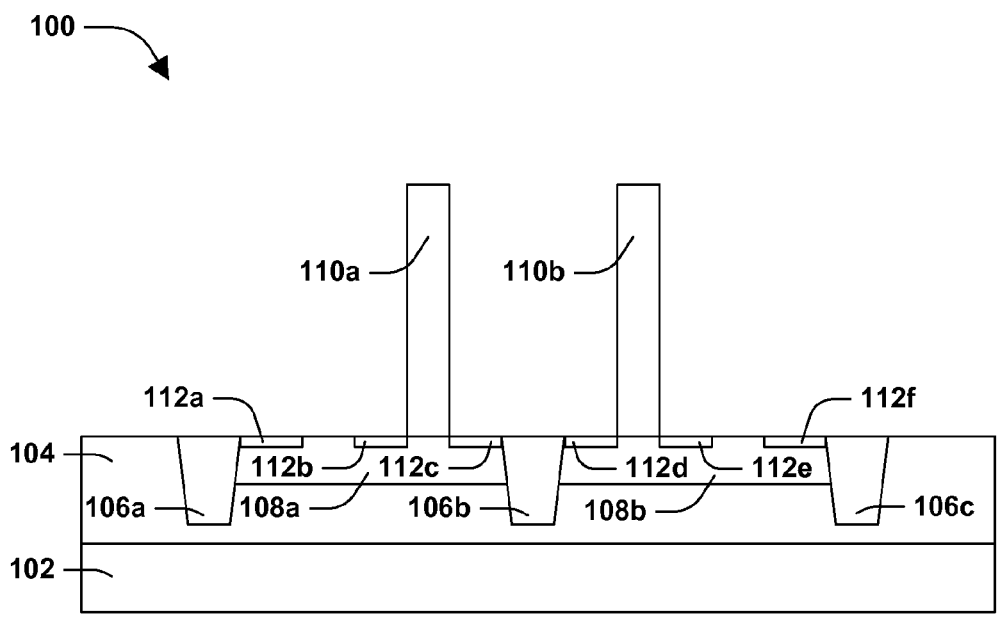
FIG. 3 is an illustration of a semiconductor device at a stage of fabrication, in accordance with some embodiments.

Turning to FIG. 3, at least one of a first silicide portion 112a is formed from the first metal portion 111a, a second silicide portion 112b is formed from the second metal portion 111b, a fifth silicide portion 112c is formed from the fifth metal portion 111c, a sixth silicide portion 112d is formed from the sixth metal portion 111d, a fourth silicide portion 112e is formed from the fourth metal portion 111e, or a third silicide portion 112f is formed from the third metal portion 111f by a thermal process, according to some embodiments. In some embodiments, the thermal process comprises heating the semiconductor device 100 to a temperature between about 200° C. to about 800° C. for a duration between 1 sec to 30 min. In some embodiments, at least one of the first nanowire 110a or the second nanowire 110b is formed after the thermal process. In some embodiments, such as when the first nanowire 110a is formed after the thermal process, the first nanowire 110a is formed between the second silicide portion 112b and the fifth silicide portion 112c. In some embodiments, such as when the second nanowire 110b is formed after the thermal process, the second nanowire 110b is formed between the fourth silicide portion 112e and the sixth silicide portion 112d. In some embodiments, the area over the first conductive portion 108a where the first silicide portion 112a and the second silicide portion 112b are not in contact forms a first break. In some embodiments, the area over the second conductive portion 108b where the third silicide portion 112f and the fourth silicide portion 112e are not in contact forms a second break.

Figure 4:
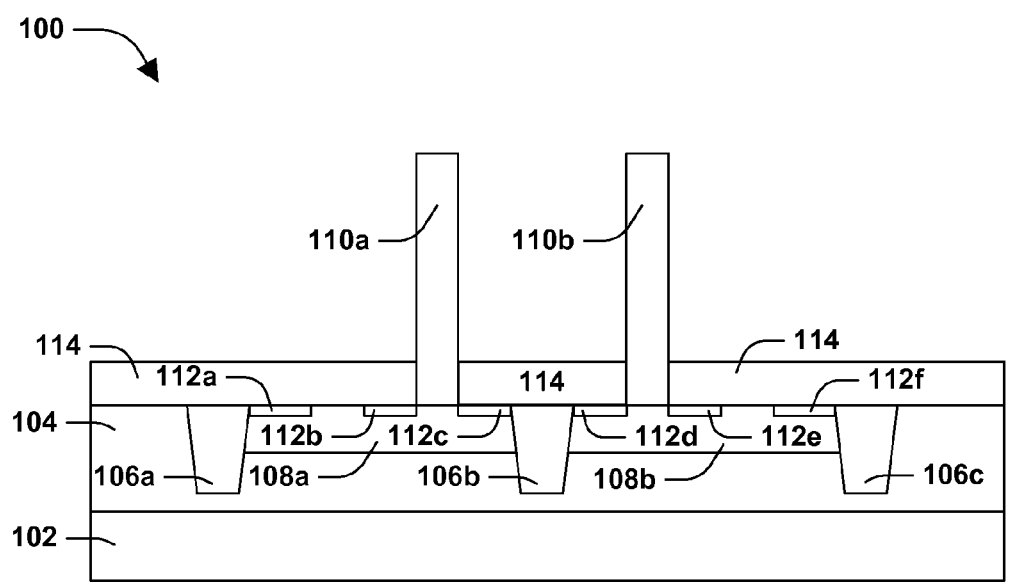
FIG. 4 is an illustration of a semiconductor device at a stage of fabrication, in accordance with some embodiments.

Turning to FIG. 4, a first dielectric layer 114 is formed over at least one of the well 104, the first STI region 106a, the first silicide portion 112a, the first conductive portion 108a, the second silicide portion 112b, the fifth silicide portion 112c, the STI region 106b, the sixth silicide portion 112d, the fourth silicide portion 112e, the second conductive portion 108b, the third silicide portion 112f, or the second STI region 106c, according to some embodiments. In some embodiments, the first dielectric layer 114 is formed on sidewalls of at least one of the first nanowire 110a or the second nanowire 110b. In some embodiments, the first dielectric layer 114 comprises a low dielectric constant material. In some embodiments, the first dielectric layer 114 comprises at least one of nitride, oxide, etc. In some embodiments, the first dielectric layer 114 is at least one of grown, deposited, etc. In some embodiments, the first dielectric layer 114 is formed by at least one of atomic layer deposition (ALD), chemical vapor deposition (CVD), physical vapor deposition (PVD), etc.

Figure 5:
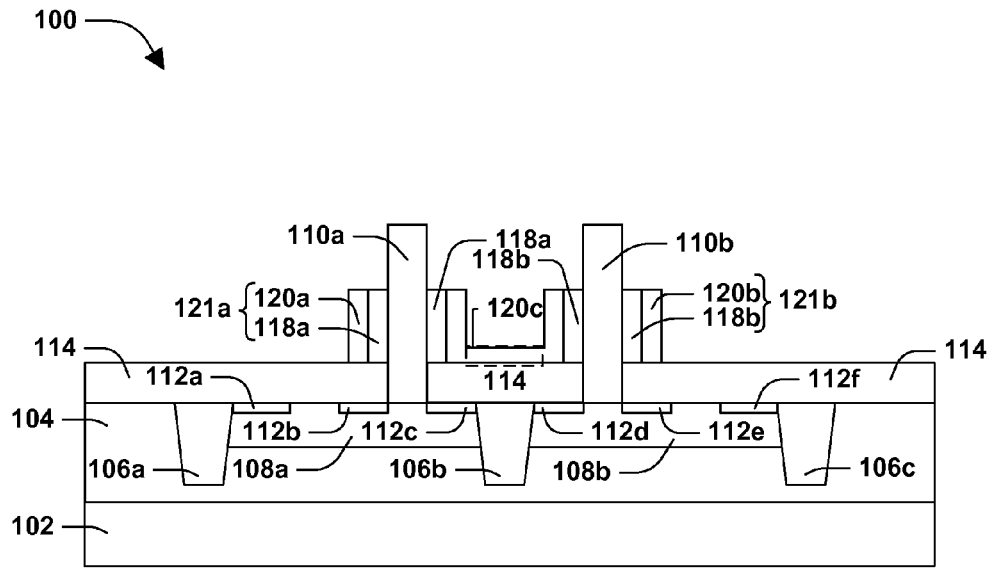
FIG. 5 is an illustration of a semiconductor device at a stage of fabrication, in accordance with some embodiments.

Turning to FIG. 5, at least one of a first gate 121a is formed around the first nanowire 110a or a second gate 121b is formed around the second nanowire 110b, according to some embodiments. In some embodiments, a layer of gate dielectric material (not shown) is formed over the first dielectric layer 114 and on sidewalls of the first nanowire 110a and the second nanowire 110b. In some embodiments, the layer of gate dielectric material comprises a high dielectric constant material. In some embodiments, the layer of gate dielectric material comprises at least one of nitride, oxide, etc. In some embodiments, the layer of gate dielectric material is formed by at least one of growth, deposition, etc. In some embodiments, the layer of gate dielectric material is formed by at least one of ALD, PVD, CVD, etc. In some embodiments, the layer of gate dielectric material is patterned to form a first gate dielectric 118a around the first nanowire 110a and a second gate dielectric 118b around the second nanowire 110b. In some embodiments, the layer of gate dielectric material is patterned by etching.

According to some embodiments, a layer of gate electrode material (not shown) is formed over the first dielectric material 114, the first gate dielectric 118a, and the second gate dielectric 118b. In some embodiments, the layer of gate electrode material comprises at least one of metal, polysilicon, etc. In some embodiments, the layer of gate electrode material is formed by at least one of growth, deposition, etc. In some embodiments, the layer of gate electrode material is formed by at least one of ALD, PVD, CVD, etc. In some embodiments, the layer of gate electrode material is patterned to form a first gate electrode 120a around the first gate dielectric 118a to form the first gate 121a. In some embodiments, the layer of gate electrode material is patterned to form a second gate electrode 120b around the second gate dielectric 118b to form the second gate 121b. In some embodiments, the layer of gate electrode material is patterned to form a gate connection 120c. In some embodiments, the gate connection 120c connects the first gate electrode 120a to the second gate electrode 120b. In some embodiments, the layer of gate electrode material is patterned by etching.

Figure 6:
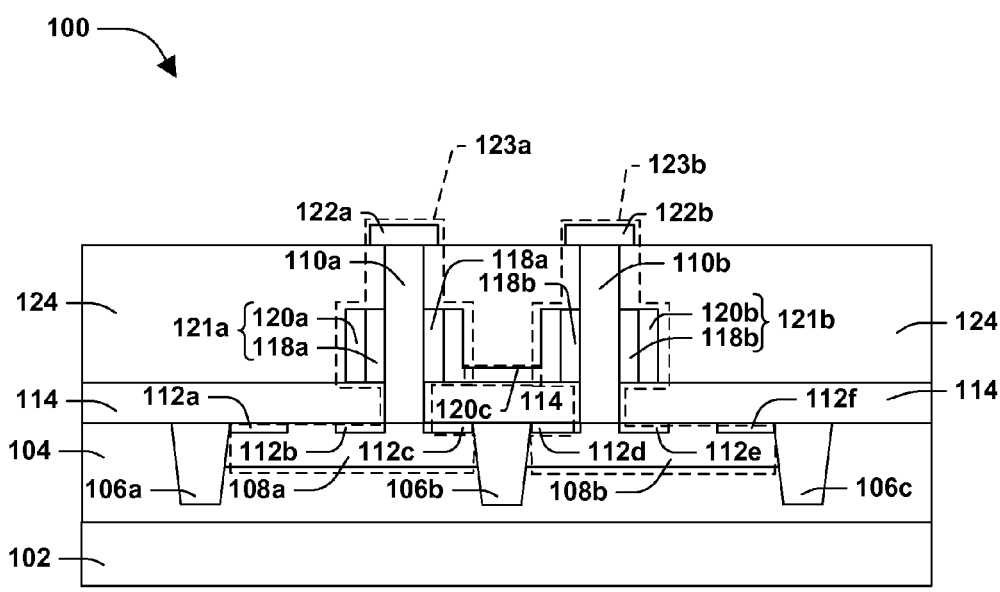
FIG. 6 is an illustration of a semiconductor device at a stage of fabrication, in accordance with some embodiments.

Turning to FIG. 6, a second dielectric layer 124 is formed over at least one of the first dielectric layer 114, the first gate 121a, the second gate 121b, the gate connection 120c, the first nanowire 110a, or the second nanowire 110b, according to some embodiments. In some embodiments, the second dielectric layer 124 comprises a low dielectric constant material. In some embodiments, the second dielectric layer 124 comprises at least one of nitride, oxide, etc. In some embodiments, the second dielectric layer 124 is at least one of grown, deposited, etc. In some embodiments, the second dielectric layer 124 is formed by at least one of ALD, CVD, PVD, etc. In some embodiments, the second dielectric layer 124 comprises the same material as the first dielectric layer 114. In some embodiments, the second dielectric layer 124 is planerized by chemical mechanical planarization (CMP) such that at least one of a top surface of the first nanowire 110a or a top surface of the second nanowire 110b is exposed.

According to some embodiments, a first active area 122a is formed over the first nanowire 110a and a second active area 122b is formed over the second nanowire 110b. In some embodiments, a layer of active area material (not shown) is formed over the second dielectric layer 124, the first nanowire 110a, and the second nanowire 110b. In some embodiments, the layer of active area material is at least one of grown, deposited, etc. In some embodiments, the layer of active area material is formed by at least one of ALD, CVD, PVD, etc. In some embodiments, the layer of active area material has the second conductivity type. In some embodiments, the layer of active area material is patterned to form the first active area 122a and the second active area 122b.

According to some embodiments, the first conductive portion 108a, the first nanowire 110a, the first gate 121a, and the first active area 122a form a first transistor 123a. In some embodiments, the first conductive portion 108a comprises at least one of a source or a drain. In some embodiments, the first nanowire 110a comprises a channel. In some embodiments, the first active area 122a comprises a source if the first conductive portion 108a comprises a drain, and a drain if the first conductive portion 108a comprises a source. In some embodiments, the second conductive portion 108b, the second nanowire 110b, the second gate 121b, and the second active area 122b form a second transistor 123b. In some embodiments, the second conductive portion 108b comprises at least one of a source or a drain. In some embodiments, the second nanowire 110b comprises a channel. In some embodiments, the second active area 122b comprises a source if the second conductive portion 108b comprises a drain, and a drain if the second conductive portion 108b comprises a source.

Figure 7:
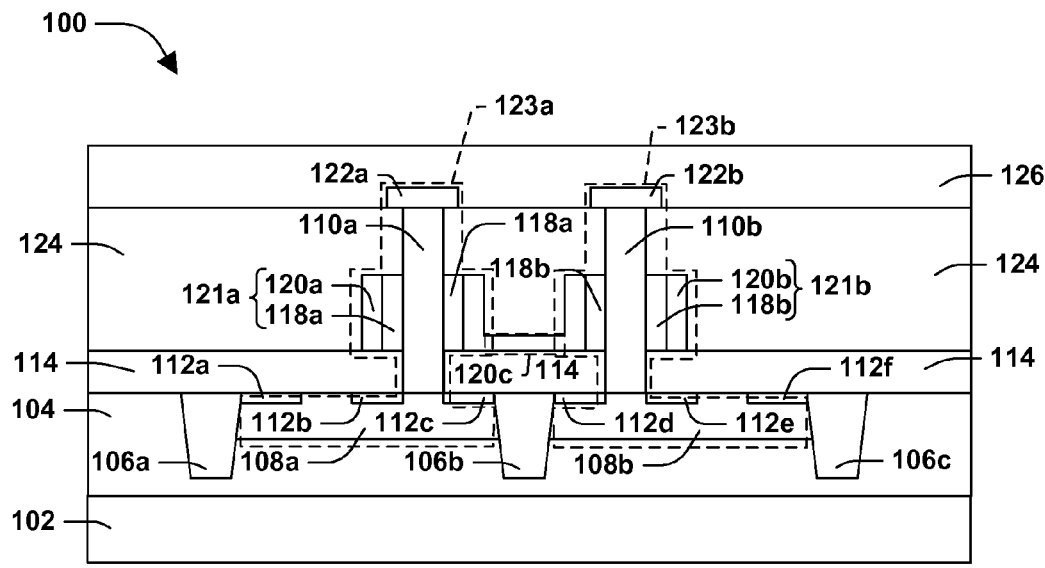
FIG. 7 is an illustration of a semiconductor device at a stage of fabrication, in accordance with some embodiments.

Turning to FIG. 7, a third dielectric layer 126 is formed over the second dielectric layer 124, the first active area 122a, and the second active area 122b, according to some embodiments. In some embodiments, the third dielectric layer 126 comprises a low dielectric constant material. In some embodiments, the third dielectric layer 126 comprises at least one of nitride, oxide, etc. In some embodiments, the third dielectric layer 126 comprises the same material as the second dielectric layer 124. In some embodiments, the third dielectric layer 126 is at least one of grown, deposited, etc. In some embodiments, the third dielectric layer 126 is formed by at least one of ALD, CVD, PVD, etc.

Figure 8:
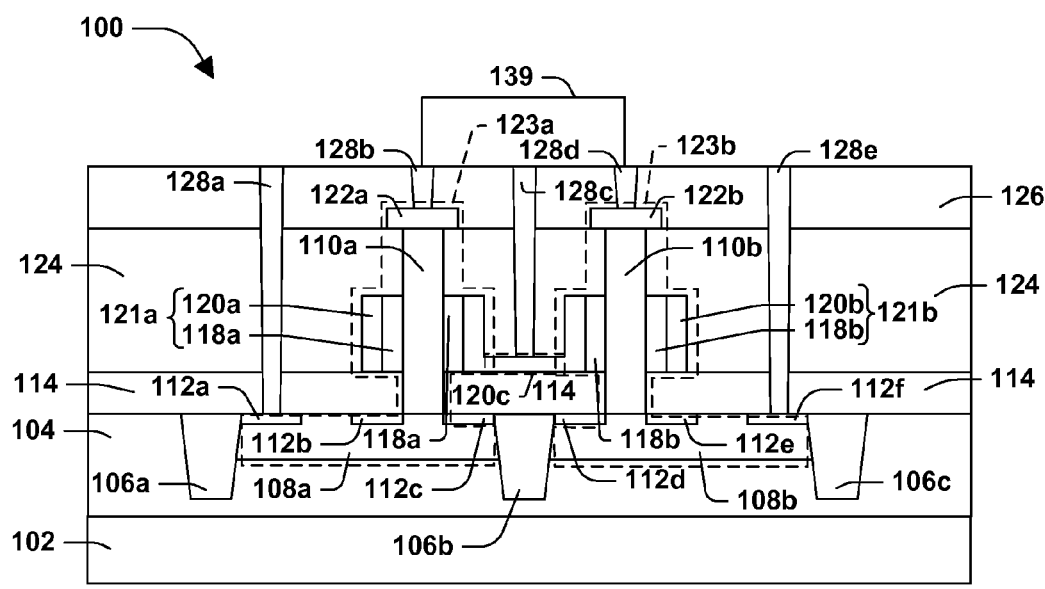
FIG. 8 is an illustration of a semiconductor device at a stage of fabrication, in accordance with some embodiments.

Turning to FIG. 8, an input contact 128a is formed over and connected to the first silicide portion 112a, a first transistor contact 128b is formed over and connected to the first active area 122a, a gate contact 128c is formed over and connected to the gate connection 120c, a second transistor contact 128d is formed over and connected to the second active area 122b, and an output contact 128e is formed over and connected to the third silicide portion 112f, according to some embodiments. To form the input contact 128a, a first opening is formed through the third dielectric layer 126, the second dielectric layer 124 and the first dielectric layer 114 to expose at least some of the first silicide portion 112a, according to some embodiments. In some embodiments, the first opening is formed by etching. In some embodiments, a conductive material is formed in the first opening to form the input contact 128a. In some embodiments, the conductive material comprises at least one of metal, metalloid, etc. To form the first transistor contact 128b, a second opening is formed through the third dielectric layer 126 to expose at least some of the first active area 122a, according to some embodiments. In some embodiments, the second opening is formed by etching. In some embodiments, a conductive material is formed in the second opening to form the first transistor contact 128b. In some embodiments, the conductive material comprises at least one of metal, metalloid, etc. To form the gate contact 128c, a third opening is formed through the third dielectric layer 126 and the second dielectric layer 124 to expose at least some of the gate connection 120c, according to some embodiments. In some embodiments, the third opening is formed by etching. In some embodiments, a conductive material is formed in the third opening to form the gate contact 128c. In some embodiments, the conductive material comprises at least one of metal, metalloid, etc. To form the second transistor contact 128d, a fourth opening is formed through the third dielectric layer 126 to expose at least some of the second active area 122b, according to some embodiments. In some embodiments, the fourth opening is formed by etching. In some embodiments, a conductive material is formed in the fourth opening to form the second transistor contact 128d. In some embodiments, the conductive material comprises at least one of metal, metalloid, etc. To form the output contact 128e, a fifth opening is formed through the third dielectric layer 126, the second dielectric layer 124, and the first dielectric layer 114 to expose at least some of the third silicide portion 112f. In some embodiments, the fifth opening is formed by etching. In some embodiments, a conductive material is formed in the fifth opening to form the output contact 128e. In some embodiments, the conductive material comprises at least one of metal, metalloid, etc. In some embodiments, an active area connection 139 connects the first active area 122a to the second active area 122b.

Figure 9:
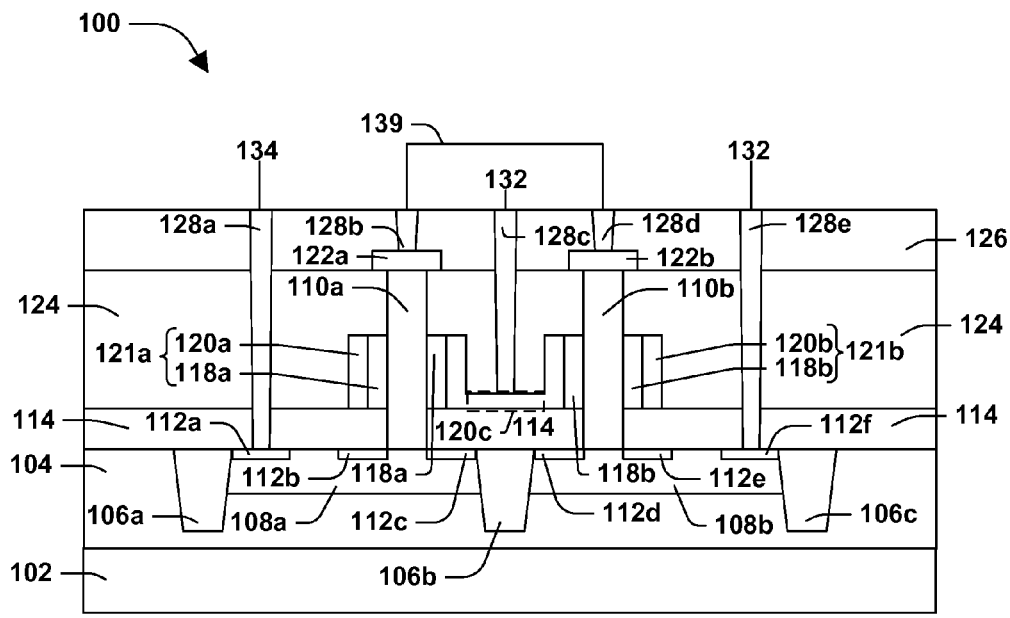
FIG. 9 is an illustration of a semiconductor device at a stage of fabrication, in accordance with some embodiments.

Turning to FIG. 9, the input contact 128a is connected to a second voltage supply (VSS) 134, the gate contact 128c is connected to a first voltage supply (VDD) 132, and the output contact 128e is connected to the VDD 132, according to some embodiments. In some embodiments, the VDD 132 is a voltage greater than 0V. In some embodiments, the VSS 134 comprises a voltage substantially equal to 0V.

Figure 10:
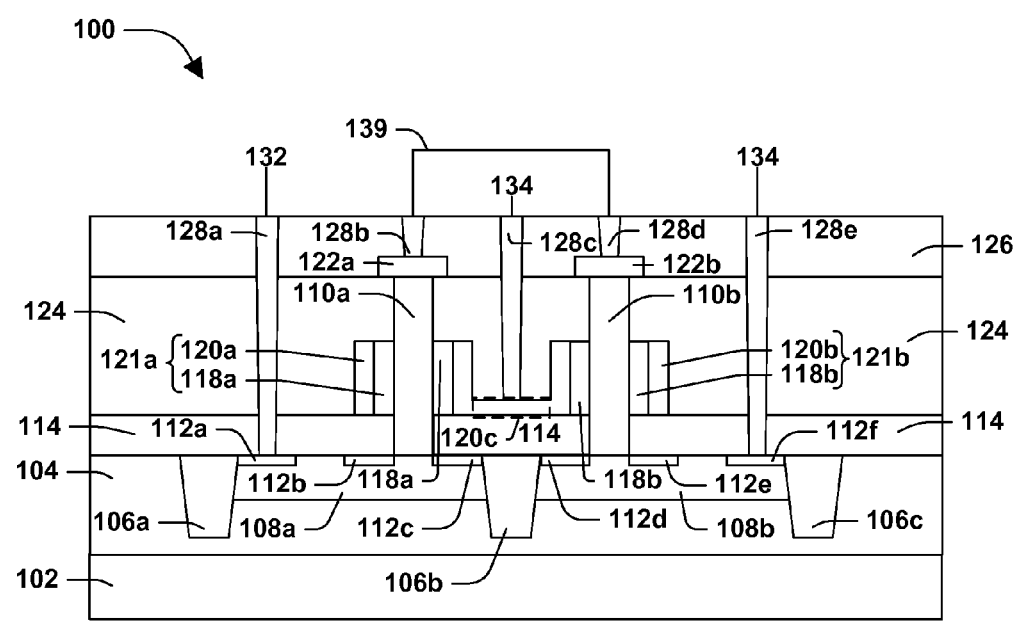
FIG. 10 is an illustration of a semiconductor device at a stage of fabrication, in accordance with some embodiments.

Turning to FIG. 10, the input contact 128a is connected to the VDD 132, the gate contact 128c is connected to the VSS 134, and the output contact 128e is connected to the VSS 134, according to some embodiments.

Figure 11:
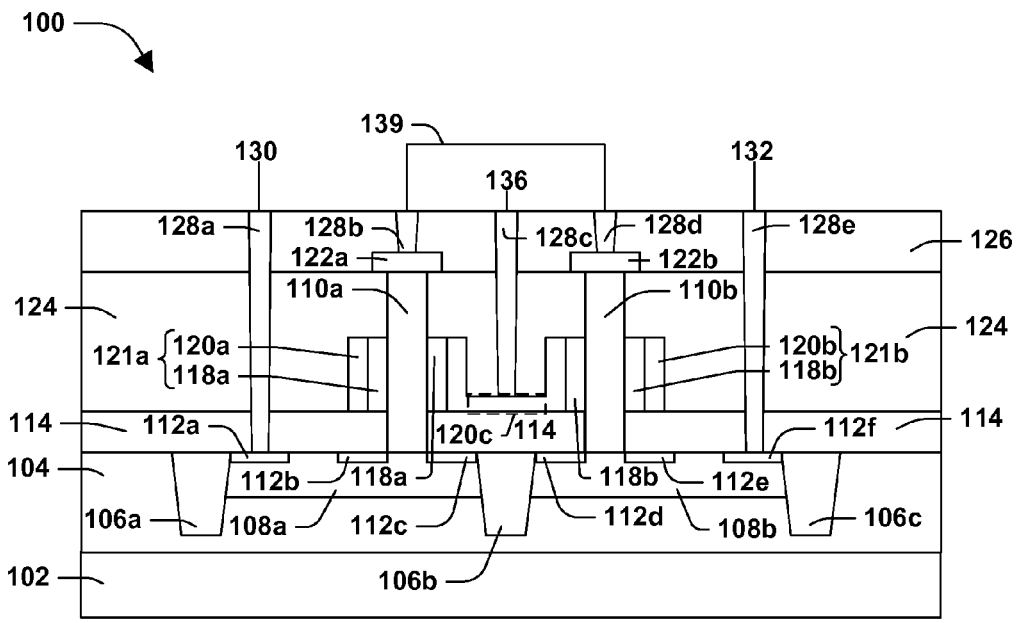
FIG. 11 is an illustration of a semiconductor device at a stage of fabrication, in accordance with some embodiments.

Turning to FIG. 11, the input contact 128a is connected to an input output (I/O) port 130, the gate contact 128c is connected to a third voltage supply 136, and the output contact 128e is connected to the VDD 132, according to some embodiments. In some embodiments, the I/O port 130 is a connection to an outside voltage source. In some embodiments, the third voltage supply 136 applies a voltage to the gate connection 120c to turn the first gate 121a and the second gate 121b "on" or "off" where the gates 121a and 121b are generally regarded as "on" when current flows through the first nanowire 110a and the second nanowire 110b and are generally regarded as "off" when current does not flow through the first nanowire 110a and the second nanowire 110b.

Figure 12:
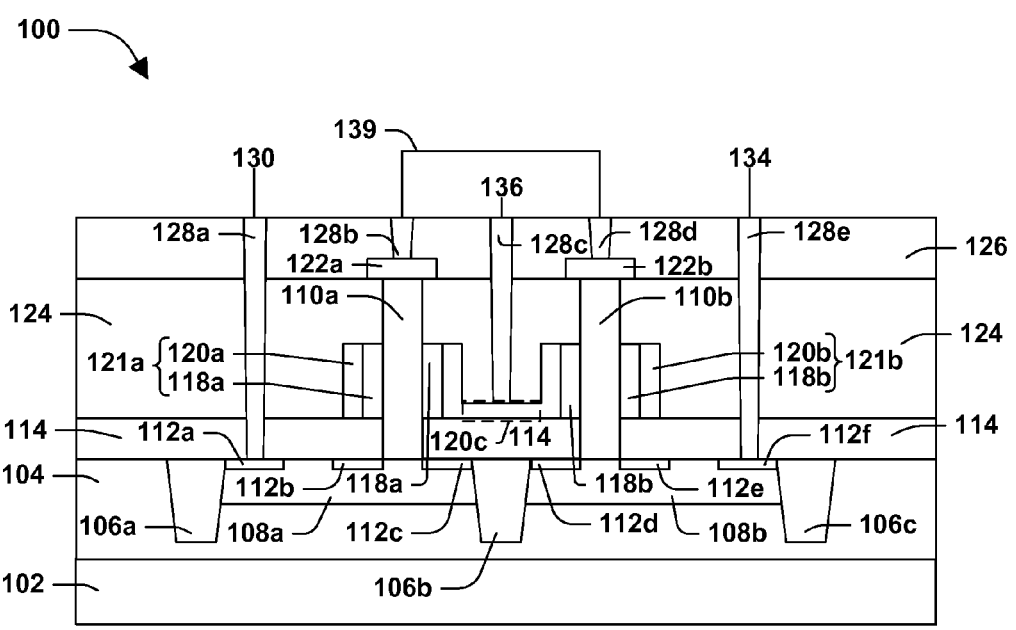
FIG. 12 is an illustration of a semiconductor device at a stage of fabrication, in accordance with some embodiments.

Turning to FIG. 12, the input contact 128a is connected to the I/O port 130, the gate contact 128c is connected to the third voltage supply 136, and the output contact 128e is connected to the VSS 134, according to some embodiments.

Figure 13:
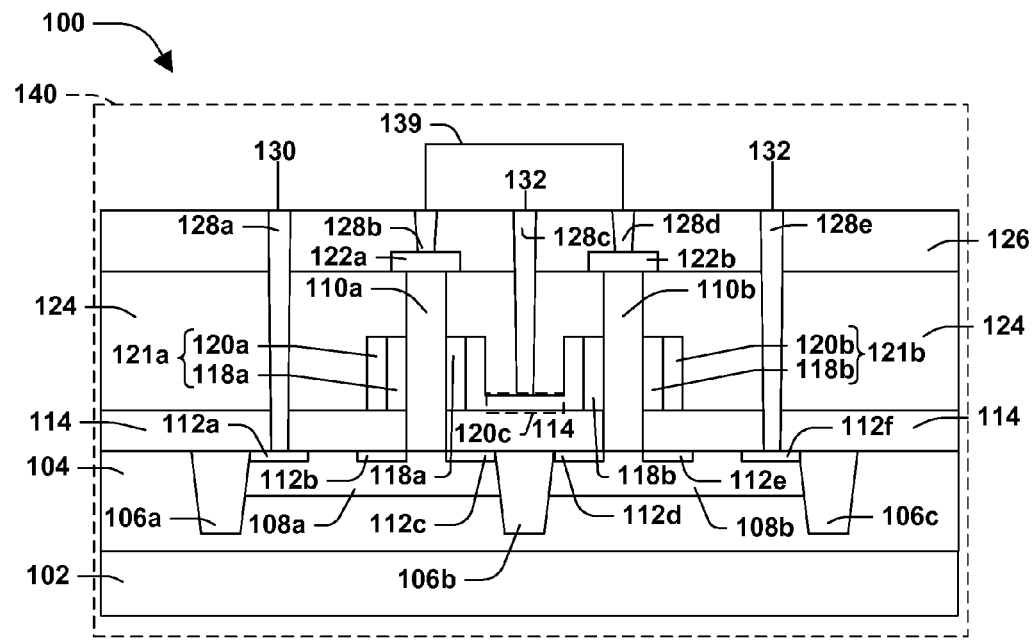
FIG. 13 is an illustration of a semiconductor device at a stage of fabrication, in accordance with some embodiments.

Turning to FIG. 13, the input contact 128a is connected to the I/O port 130, the gate contact 128c is connected to the VDD 132, and the output contact 128e is connected to the VDD 132 to form a first I/O clamp 140, according to some embodiments.

Figure 14:
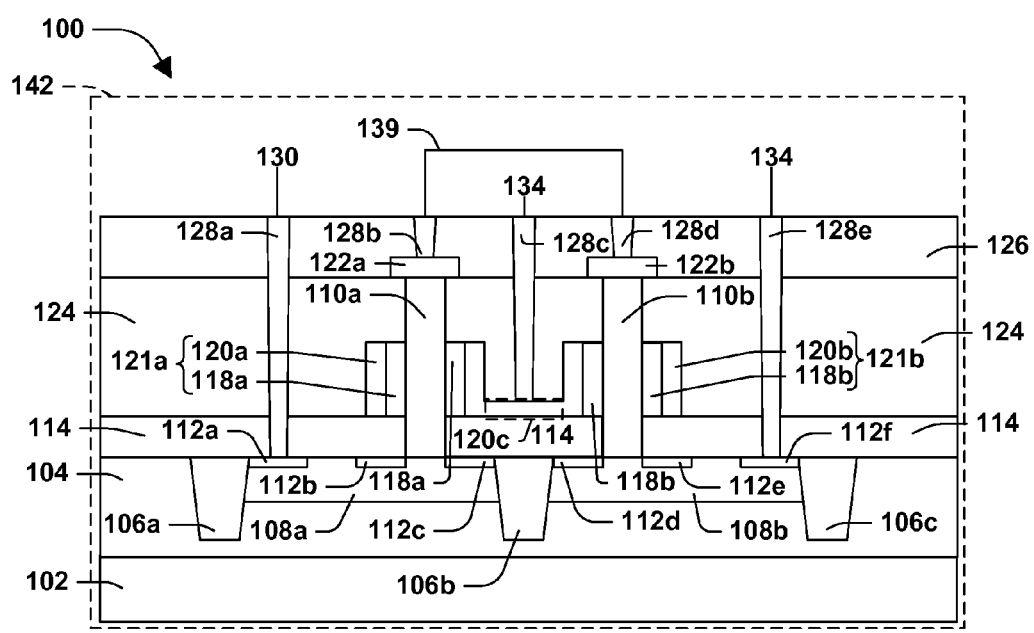
FIG. 14 is an illustration of a semiconductor device at a stage of fabrication, in accordance with some embodiments.

Turning to FIG. 14, the input contact 128a is connected to the I/O port 130, the gate contact 128c is connected to the VSS 134, and the output contact 128e is connected to the VSS 134 to form a second I/O clamp 142, according to some embodiments. Turning to FIG. 15, the input contact 128a is connected to the VDD 132, the gate contact 128c is connected to the third voltage supply 136, and the output contact 128e is connected to the VSS 134 to form a power clamp circuit 144, according to some embodiments.

Turning to FIG. 16, the semiconductor arrangement 200 comprising the first I/O clamp 140 connected to the VDD 132 and the I/O port 130, the second I/O clamp 142 connected to the VSS 134 and the I/O port 130, internal circuits connected to the I/O port 130, and the power clamp circuit 144 connected to the VDD 132 and the VSS 134, according to some embodiments. In some embodiments, at least one of the first I/O clamp 140 or the second I/O clamp 142 protects the internal circuits from electrostatic discharge (ESD) events.

According to some embodiments, such as when an ESD event occurs, a voltage bias is applied to at least one of the first gate 121a or the second gate 121b, such that little to no current travels through at least one of the first nanowire 110a or the second nanowire 110b. In some embodiments, excess current from the ESD event travels through at least one of a first path from the input contact 128a to the first conductive portion 108a through the well 104 to the second conductive portion 108b and out through the output contact 128c, or a second path from the output contact 128e to the second conductive portion 108b through the well 104 to the first conductive portion 108a and out through the input contact 128a, bypassing the first nanowire 110a and the second nanowire 110b. In some embodiments, by bypassing the first nanowire 110a and the second nanowire 110b a functional lifetime of the first nanowire 110a and the second nanowire 110b is increased as compared to a semiconductor device that does not have a mechanism that facilitates bypassing a nanowire during an ESD event. In some embodiments, at least one of the first path or the second path increases ESD discharge capability as compared to a semiconductor device that does not have at least one of the first path or the second path. In some embodiments, such as when the first gate 121a is connected to the third voltage supply 136, a moderate amount of current from an ESD event travels through at least one of the first nanowire 110a or the second nanowire 110b, while a majority of excess current travels through at least one of the first path or the second path. In some embodiments, the semiconductor device 100 having at least one of the first break or the second break has a more uniform turn on than a semiconductor device that does not have at least one of such breaks.

According to some embodiments, a semiconductor device comprises a first conductive portion on a first side of a shallow trench isolation (STI) region. In some embodiments, the first conductive portion is formed within a well having a first conductivity type. In some embodiments, the first conductive portion has a second conductivity type and is connected to a first nanowire and at least one of an input output (I/O) port, a first voltage supply (VDD), or a second voltage supply (VSS). In some embodiments, a second conductive portion is on a second side of the STI region. In some embodiments, the second conductive portion is formed within the well and has the second conductivity type. In some embodiments, the second conductive portion is connected to a second nanowire and at least one of the VSS or the VDD when the first conductive portion is connected to the I/O port, the VSS when the first conductive portion is connected to the VDD, or the VDD when the first conductive portion is connected to the VSS.

According to some embodiments, a semiconductor device comprises a first conductive portion on a first side of a shallow trench isolation (STI) region, the first conductive portion connected to a first nanowire, and a second conductive portion on a second side of the STI region, the second conductive portion connected to a second nanowire. In some embodiments, a first silicide portion is over the first conductive portion. In some embodiments, the first conductive portion is connected, through the first silicide portion, to at least one of an input output (I/O) port, a first voltage supply (VDD), or a second voltage supply (VSS) through the first silicide portion. In some embodiments, a second silicide portion is over the first conductive portion. In some embodiments, the second silicide portion is adjacent the first nanowire and not in contact with the first silicide portion. In some embodiments, a third silicide portion is over the second conductive portion. In some embodiments, the second conductive portion is connected, through the third silicide portion, to at least one of the VSS or the VDD when the first conductive portion is connected to the I/O port, the VSS when the first conductive portion is connected to the VDD, or the VDD when the first conductive portion is connected to the VSS.

According to some embodiments, a semiconductor device comprises a first transistor on a first side of a shallow trench isolation (STI) region. In some embodiments, the first transistor comprises a first conductive portion formed within a well having a first conductivity type, the first conductive portion having a second conductivity type, a first nanowire connected to the first conductive portion, a first gate surrounding the first nanowire, and a first active area over the first nanowire and having the second conductivity type. In some embodiments, a second transistor is on a second side of the STI region. In some embodiments, the second transistor comprises a second conductive portion formed within the well, the second conductive portion having the second conductivity type, a second nanowire connected to the second conductive portion and to the first nanowire, a second gate surrounding the second nanowire and connected to the first gate by a gate connection, and a second active area over the second nanowire and having the second conductivity type.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
    a first conductive portion on a first side of a shallow trench isolation (STI) region, the first conductive portion formed within a well having a first conductivity type, the first conductive portion having a second conductivity type and connected to a first nanowire and at least one of an input output (I/O) port, a first voltage supply (VDD), or a second voltage supply (VSS); and
    a second conductive portion on a second side of the STI region, the second conductive portion formed within the well and having the second conductivity type, the second conductive portion connected to a second nanowire and at least one of:
        the VSS or the VDD when the first conductive portion is connected to the I/O port;
        the VSS when the first conductive portion is connected to the VDD; or
        the VDD when the first conductive portion is connected to the VSS.

2. The semiconductor device of claim 1, comprising:
    a first silicide portion over the first conductive portion; and
    a second silicide portion over the first conductive portion adjacent the first nanowire, the second silicide portion not in contact with the first silicide portion.

3. The semiconductor device of claim 1, comprising:
    a third silicide portion over the second conductive portion; and
    a fourth silicide portion over the second conductive portion adjacent the second nanowire, the fourth silicide portion not in contact with the third silicide portion.

4. The semiconductor device of claim 1, the first nanowire connected to the second nanowire.

5. The semiconductor device of claim 1, comprising:
    a first gate surrounding the first nanowire; and
    a second gate surrounding the second nanowire, where the first gate is connected to the second gate by a gate connection.

6. The semiconductor device of claim 5, comprising a gate contact connected to the gate connection and at least one of the VDD, the VSS, or a third voltage supply.

7. The semiconductor device of claim 1, comprising a first active area over the first nanowire, the first active area having the second conductivity type.

8. The semiconductor device of claim 7, comprising a second active area over the second nanowire, the second active area having the second conductivity type.

9. The semiconductor device of claim 8, the first nanowire connected to the second nanowire via the first active area, an active area connection, and the second active area.

10. A semiconductor device comprising:
    a first conductive portion on a first side of a shallow trench isolation (STI) region, the first conductive portion connected to a first nanowire;
    a second conductive portion on a second side of the STI region, the second conductive portion connected to a second nanowire;
    a first silicide portion over the first conductive portion, where the first conductive portion is connected, through the first silicide portion, to at least one of an input output (I/O) port, a first voltage supply (VDD), or a second voltage supply (VSS) through the first silicide portion;
    a second silicide portion over the first conductive portion, the second silicide portion adjacent the first nanowire and not in contact with the first silicide portion; and
    a third silicide portion over the second conductive portion, where the second conductive portion is connected, through the third silicide portion, to at least one of:
        the VSS or the VDD when the first conductive portion is connected to the I/O port;
        the VSS when the first conductive portion is connected to the VDD; or
        the VDD when the first conductive portion is connected to the VSS.

11. The semiconductor device of claim 10, comprising a fourth silicide portion over the second conductive portion, the fourth silicide portion adjacent the second nanowire and not in contact with the third silicide portion.

12. The semiconductor device of claim 10, comprising:
    a first gate surrounding the first nanowire; and
    a second gate surrounding the second nanowire, where the first gate is connected to the second gate by a gate connection.

13. The semiconductor device of claim 12, comprising a gate contact connected to the gate connection and at least one of the VDD, the VSS, or a third voltage supply.

14. The semiconductor device of claim 10, the first conductive portion and the second conductive portion formed within a well having a first conductivity type, the first conductive portion and the second conductive portion having a second conductivity type.

15. The semiconductor device of claim 14, comprising at least one of:
    a first active area over the first nanowire, the first active area having the second conductivity type; or a second active area over the second nanowire, the second active area having the second conductivity type.

16. The semiconductor device of claim 15, the first nanowire connected to the second nanowire via the first active area, an active area connection, and the second active area.

17. A semiconductor device comprising:
a first transistor on a first side of a shallow trench isolation (STI) region, the first transistor comprising:
a first conductive portion formed within a well having a first conductivity type, the first conductive portion having a second conductivity type;
a first nanowire connected to the first conductive portion;
a first gate surrounding the first nanowire; and
a first active area over the first nanowire and having the second conductivity type; and
a second transistor on a second side of the STI region, the second transistor comprising:
a second conductive portion formed within the well, the second conductive portion having the second conductivity type;
a second nanowire connected to the second conductive portion and to the first nanowire;
a second gate surrounding the second nanowire and connected to the first gate by a gate connection; and
a second active area over the second nanowire and having the second conductivity type.

18. The semiconductor device of claim 17, comprising:
a first silicide portion over the first conductive portion, the first conductive portion connected, through the first silicide portion, to at least one of an input output (I/O) port, a first voltage supply (VDD), or a second voltage supply (VSS) through the first silicide portion; and
a second silicide portion over the first conductive portion, the second silicide portion adjacent the first nanowire and not in contact with the first silicide portion.

19. The semiconductor device of claim 18, comprising:
a third silicide portion over the second conductive portion, the second conductive portion connected, through the third silicide portion, to at least one of:
the VSS or the VDD when the first conductive portion is connected to the I/O port;
the VSS when the first conductive portion is connected to the VDD; or
the VDD when the first conductive portion is connected to the VSS; and
a fourth silicide portion over the second conductive portion, the fourth silicide portion adjacent the second nanowire and not in contact with the third silicide portion.

20. The semiconductor device of claim 17, comprising a gate contact connected to the gate connection and at least one of the VDD, the VSS, or a third voltage supply.

* * * * *